(12) United States Patent
Chan

(10) Patent No.: US 9,763,359 B2
(45) Date of Patent: Sep. 12, 2017

(54) HEAT PIPE WITH NEAR-AZEOTROPIC BINARY FLUID

(71) Applicant: Oracle International Corporation, Redwood City, CA (US)

(72) Inventor: Albert Chan, Redwood City, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 139 days.

(21) Appl. No.: 14/726,171

(22) Filed: May 29, 2015

(65) Prior Publication Data

US 2016/0353610 A1 Dec. 1, 2016

(51) Int. Cl.
- *H05K 7/20* (2006.01)
- *F28D 15/04* (2006.01)
- *G06F 1/20* (2006.01)
- *H01L 23/427* (2006.01)

(52) U.S. Cl.
CPC ......... *H05K 7/20336* (2013.01); *F28D 15/04* (2013.01); *G06F 1/20* (2013.01); *H05K 7/2039* (2013.01); *H01L 23/427* (2013.01)

(58) Field of Classification Search
None
See application file for complete search history.

(56) References Cited

U.S. PATENT DOCUMENTS

| | | | |
|---|---|---|---|
| 2,832,664 A * | 4/1958 | Bloch | A61L 17/08 422/28 |
| 3,777,811 A | 12/1973 | Shcosinger | |
| 4,082,863 A | 4/1978 | Dancy et al. | |
| 5,716,458 A * | 2/1998 | Machino | B08B 3/08 134/1 |
| 6,515,857 B2 * | 2/2003 | Ford | G06F 1/203 313/113 |
| 6,684,940 B1 | 2/2004 | Chao et al. | |

(Continued)

OTHER PUBLICATIONS

Wilson, Abraham et al., Vapor-Liquid Equilibria, 2-Propanol-Water System, Industrial & Engineering Chemistry vol. 44, No. 9, pp. 2214-2219, 1952.*

(Continued)

*Primary Examiner* — Robert J Hoffberg
(74) *Attorney, Agent, or Firm* — Park, Vaughan, Fleming & Dowler LLP

(57) ABSTRACT

A heat pipe includes a binary working fluid including a composition proximate to and less than or equal to the azeotropic point in a thermodynamic phase diagram as a function of the composition of the binary working fluid. Moreover, in a liquid phase of the binary working fluid, a boiling point of the binary working fluid as a function of temperature and the composition in the thermodynamic phase diagram is approximately constant. For example, the boiling point may vary by less than a degree Celsius over a range of compositions proximate to and less than or equal to the azeotropic point. Furthermore, components in the binary working fluid may be fully miscible as a function of the temperature and the composition in the thermodynamic phase diagram, a component in the binary working fluid may include a non-zero dipole moment, and/or the component may form a hydrogen bond with water.

14 Claims, 4 Drawing Sheets

(56) References Cited

U.S. PATENT DOCUMENTS

| | | | |
|---|---|---|---|
| 6,725,682 B2 | 4/2004 | Scott | |
| 6,914,780 B1* | 7/2005 | Shanker | F28D 15/0233 |
| | | | 165/104.33 |
| 9,352,856 B1* | 5/2016 | Wu | B64G 1/503 |
| 2007/0085054 A1 | 4/2007 | Lin | |
| 2010/0025009 A1* | 2/2010 | Klett | F28D 15/0241 |
| | | | 165/46 |
| 2011/0220327 A1* | 9/2011 | Yoshihara | F28D 15/02 |
| | | | 165/104.21 |
| 2011/0284187 A1* | 11/2011 | Yoshihara | F28D 15/0266 |
| | | | 165/104.19 |
| 2013/0081788 A1 | 4/2013 | Yang | |
| 2014/0060048 A1 | 3/2014 | Hoos | |
| 2014/0345843 A1* | 11/2014 | Kirkor | F28F 23/00 |
| | | | 165/185 |

OTHER PUBLICATIONS

McGillis, Wade et al., Boiling Binary Mixtures at Subatmospheric Pressures, Digital Western Research Laboratory Technical Note TN-23, Jan. 1992, 38 pages.*

Vasiliev, L. L. et al., Heat Pipes and Solid Sorption Transformations: Fundamentals and Practical Applications, CRC Press, pp. i-xviii and 319-356, 2013.*

Mozumder et al.; "Performance of Heat Pipe for Different Working Fluids and Fill Ratios", Journal of Mechanical Engineering, vol. Me 41, No. 2, Dec. 2010, Transaction of Mech. Eng. Div., The Institution of Engineers, Bangladesh.

* cited by examiner

HEAT PIPE WITH NEAR-AZEOTROPIC BINARY FLUID

BACKGROUND

Field

The present disclosure generally relates to heat-transfer techniques. More specifically, the present disclosure relates to a heat pipe that includes a binary working fluid including a composition proximate to and less than or equal to the azeotropic point on a thermodynamic phase diagram.

Related Art

The computational performance of electronic devices has increased significantly in recent years. This increased performance has been accompanied by an increase in power consumption and associated heat generation. Furthermore, this additional heat generation has made it harder to maintain acceptable internal and external operational temperatures in these electronic devices.

Heat pipes are a common, passive heat-transfer mechanism in electronic devices that leverages thermal conductivity and phase transitions to efficiently manage the heat transfer. In particular, at a hot interface of a heat pipe, a liquid phase of a working fluid in contact with a heat source via a thermally conductive solid surface turns into a gas phase by absorbing heat from the solid surface. Then, the gas travels along the heat pipe to a cold interface (which is thermally in contact with a heat sink) and condenses back into a liquid, thereby releasing the latent heat. Next, the liquid returns to the hot interface via capillary action, centrifugal force, and/or gravity, and the cycle repeats. Because of the very high heat-transfer coefficients for boiling and condensation, heat pipes are typically highly effective thermal conductors.

The working fluid used in heat pipes is often chosen to have good thermodynamic and thermal transport properties. For example, many heat pipes use water as the working fluid. Water has a very large heat of vaporization, which can allow large quantities of heat to be removed by evaporating a small amount of water. However, water has a relatively high boiling point of 100 C, which can restrict the temperature gradient between the heat source and the heat pipe and, thus, can limit the amount of heat that is removed.

Hence, what is needed is a heat pipe without the above-described problems.

SUMMARY

One embodiment of the present disclosure provides a heat pipe. This heat pipe includes a housing including a first end that can couple to a heat source and a second end that can couple to a heat sink, where the housing has an outer surface and an inner surface that defines a cavity in the heat pipe. Moreover, the heat pipe includes a wick structure coupled to the inner surface, which at least partially fills the cavity. Furthermore, the heat pipe includes a binary working fluid in the cavity including a composition proximate to and less than or equal to the azeotropic point in a thermodynamic phase diagram as a function of temperature and the composition of the binary working fluid. In a liquid phase of the binary working fluid, a boiling point of the binary working fluid as a function of the composition in the thermodynamic phase diagram is approximately constant.

Note that the binary working fluid may include isopropanol and water. For example, the composition may be between 66 and 88% isopropanol (such as between 80 and 85% isopropanol).

Moreover, components in the binary working fluid may be fully miscible as a function of the temperature and the composition in the thermodynamic phase diagram.

Furthermore, at least one of the components of the binary working fluid may have a non-zero dipole moment.

Additionally, at least one of the elements in the binary working fluid may form a hydrogen bond with water.

Note that, at the azeotropic point, a composition of a gas phase of the binary working fluid may equal a composition of a liquid phase of the binary working fluid.

In some embodiments, the boiling point varies by less than a degree Celsius as a function of the composition in the thermodynamic phase diagram for the composition proximate to and less than or equal to the azeotropic point.

Another embodiment provides an electronic device that includes a heat source, a heat sink, and the heat pipe. During operation, the heat source generates heat in the electronic device, the heat sink removes heat from the electronic device, and the heat pipe transports heat from the heat source to the heat sink.

Another embodiment provides a method for removing heat from a heat source. During the method, the heat source generates heat during operation. Then, the heat pipe transports the heat from the heat source to a heat sink. The heat pipe includes a housing with an outer surface and an inner surface that defines a cavity. Moreover, the heat pipe includes a binary working fluid in the cavity including a composition proximate to and less than or equal to the azeotropic point in a thermodynamic phase diagram as a function of temperature and the composition of the binary working fluid. Furthermore, in a liquid phase of the binary working fluid, a boiling point of the binary working fluid as a function of the composition in the thermodynamic phase diagram is approximately constant.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a heat pipe, an electronic device that includes the heat pipe, and a technique for removing heat from a heat source are described. The heat pipe includes a binary working fluid including a composition proximate to and less than or equal to an azeotropic point in a thermodynamic phase diagram as a function of temperature and the composition of the binary working fluid. Moreover, in a liquid phase of the binary working fluid, a boiling point of the binary working fluid as a function of the composition in the thermodynamic phase diagram is approximately constant. For example, the boiling point may vary by less than a degree Celsius over a range of compositions proximate to and less than or equal to the azeotropic point. Furthermore, components in the binary working fluid may be fully miscible as a function of the temperature and the composition in the thermodynamic phase diagram, a component in the binary working fluid may have a non-zero dipole moment, and/or the component may form a hydrogen bond with water.

In this way, the heat pipe may facilitate improved heat transfer. In particular, the reduced boiling point of the binary working fluid may increase the temperature gradient between the heat source and the heat pipe, thereby increasing the heat that is removed. In addition, the constraint on the variation in the boiling point of the binary working fluid as a function of composition may ensure that the binary working fluid can fully condense so that it will not block the gas flow in the heat pipe, thereby improving or maintaining the performance of the heat pipe.

Figure 1:
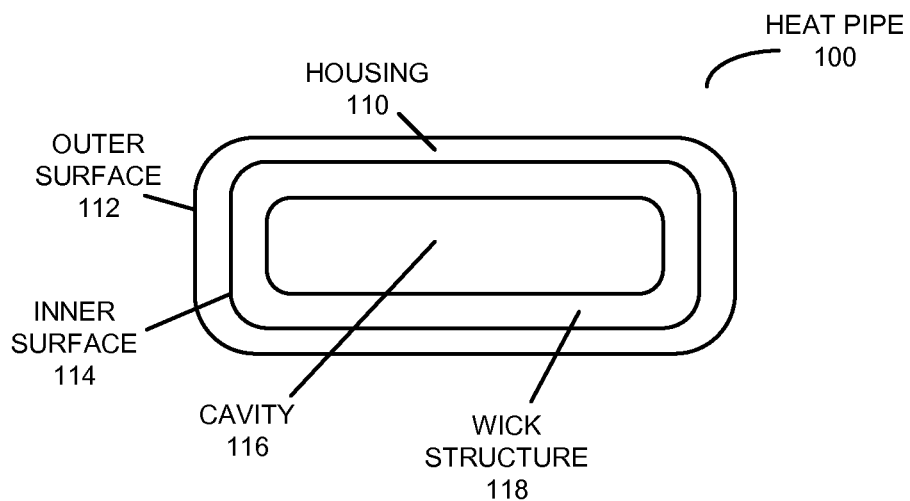
FIG. 1 is a block diagram illustrating a side view of a heat pipe in accordance with an embodiment of the present disclosure.

We now describe the heat pipe. Heat pipes are widely used in the cooling of electronic components and devices. FIG. 1 presents a block diagram illustrating a side view of a heat pipe 100. This heat pipe includes a housing 110 (which is sometimes referred to as an 'outer casing' or a 'shell') with an outer surface 112 and an inner surface 114 that defines a cavity 116 (which is sometimes referred to as a 'fluid-flow channel'). Moreover, heat pipe 100 includes a wick structure 118 coupled to inner surface 114, which at least partially fills cavity 116, and a working fluid that saturates the wick structure. Note that heatpipe 100 may be evacuated prior to being filled with the working fluid, so that the pressure inside heatpipe 100 may be the vapor pressure of the working fluid.

In an exemplary embodiment, housing 110 and wick structure 118 include copper. Moreover, wick structure 118 may be porous and may be fabricated by sintering copper particles on inner surface 114. However, other types of wick structure may be also used, such as: a wire mesh and/or grooves on inner surface 114.

Figure 2:
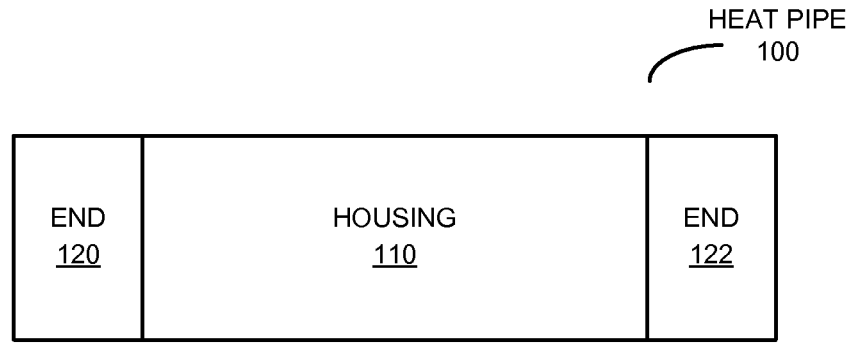
FIG. 2 is a block diagram illustrating a top view of the heat pipe of FIG. 1 in accordance with an embodiment of the present disclosure.

As shown in FIG. 2, which presents a block diagram illustrating a top view of heat pipe 100, housing 110 has an end 120 (or an evaporator) that can couple to a heat source and an end 122 (or a condenser) that can couple to a heat sink. For example, the heat source may include an integrated circuit (such as a processor, a graphics processor, and/or an application-specific integrated circuit) that generates heat during operation. Furthermore, the heat sink may be a passive or an active heat exchanger (such as a cold plate or cooling fins that are thermally coupled to a thermal reservoir, or a pump, a fan, a forced-fluid driver, etc.). Note that the heat source and the heat sink may be thermally coupled to heat pipe 100, e.g., solder, a phase-change material (such as epoxy), and/or thermal grease.

During operation, heat applied at end 120 may cause the working fluid to vaporize. The vaporization of the working fluid may absorb the heat, and the gas may be transported through cavity 116 to end 122 (which is cooler). Then, the gas may condense, and may be absorbed by wick structure 118. At end 122, heat may be removed from heat pipe 100 and may be transferred to the heat sink. Next, wick structure 118 may transport the working fluid back to end 120 through capillary flow. This may complete the working cycle of heat pipe 100. Thus, during operation, the working fluid usually includes two phases of matter, such as a liquid phase and a gas (or vapor phase). For example, the working fluid may include bubbles that include the gas. Therefore, in some embodiments, nucleation of the bubbles and/or latent heat may be used to increase the heat-transfer coefficient of the working fluid.

For cooling of electronics (such as a processor), the working fluid is typically pure water. As noted previously, water has a very large heat of vaporization, which allows large quantities of heat to be removed by evaporating a small amount of water. However, water has a relatively high boiling point of 100 C. If the steady state boiling in heat pipe 100 took place at a lower temperature, the increase in temperature gradient between the heat source and heat pipe 100 can allow more heat to be removed.

Therefore, the working fluid in heat pipe 100 may have a lower boiling point than water and a decent latent heat (such as a latent heat that is at least 50% or 75% of the latent heat of water). In an exemplary embodiment, the working fluid is a binary fluid, combining two components or constituent ingredients. For example, for a given composition, a first component may have weight percent x and a second component may have weight percent 1−x. The binary fluid may form an azeotrope (i.e., a mixture that has the same liquid-phase and gas-phase composition at the boiling point). Moreover, as described further below with reference to FIG. 3, the thermodynamic equilibrium phase diagram may have a relatively wide-range of liquid-phase compositions in which the boiling point of the liquid phase is very close to that of the azeotrope. For example, the boiling point of the working fluid may vary by less than 1 C as a function of the composition in the thermodynamic phase diagram for the composition proximate to and less than or equal to the azeotropic point. This criterion may ensure that the working fluid can fully condense so that it will not block the gas flow in heat pipe 100. Furthermore, the binary working fluid may be fully miscible as a function of the temperature and the composition in the thermodynamic phase diagram, and the binary working fluid may have a reasonably high heat of vaporization. Note that the binary fluid may also be: non-toxic, non-carcinogenic and low-cost.

In an exemplary embodiment, the binary working fluid includes isopropanol and water. For example, the composition may be between 66 and 88% isopropanol (such as between 80 and 85% isopropanol).

In some embodiments, at least one of the components in the binary working fluid has a dipole moment in the molecule. Moreover, at least the one of the components in the binary working fluid may form a hydrogen bond with water.

Figure 3:
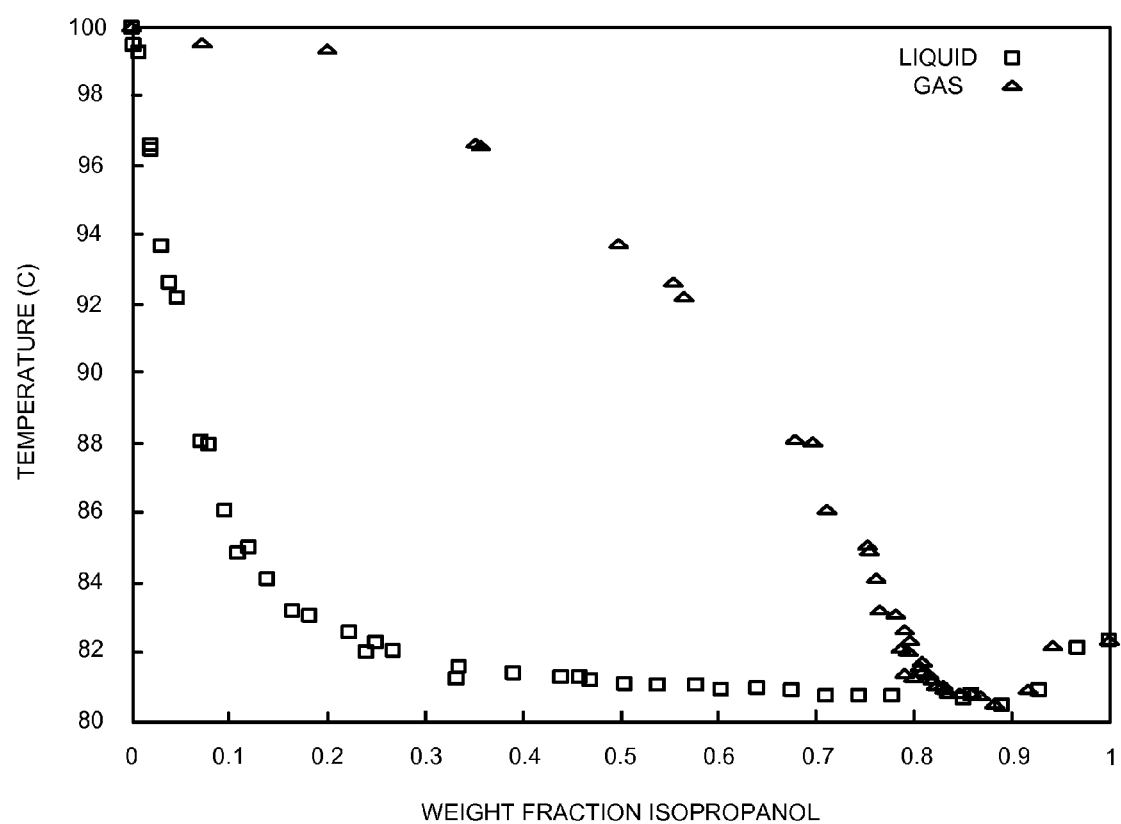
FIG. 3 is a drawing illustrating a thermodynamic phase diagram of a binary working fluid as a function of temperature and composition of the binary working fluid in accordance with an embodiment of the present disclosure.

FIG. 3 presents a drawing illustrating a thermodynamic phase diagram of a binary working fluid as a function of temperature and composition of the binary working fluid. In particular, in FIG. 3 the binary working fluid contains isopropanol and water. Note that the azeotrope is at approximately 88% isopropanol, where the gas-liquid composition is the same at boiling.

As shown in FIG. 3, the boiling point of the liquid phase varies by less than 1 C relative to the azeotrope over a relatively wide liquid-composition range. In particular, the boiling point is very close to the azeotropic boiling point of 80.5 C for liquid compositions in the range from 60 to 88%. This means that over this range of liquid compositions, the boiling point is very close to that of the azeotrope. It is then possible to fully condense the gas once the condenser section of the heat pipe cools to a temperature below the boiling point of the azeotrope. If this were not the case, non-condensed gas may block gas transport from boiling to end 122 (FIG. 2) of heat pipe 100 (FIGS. 1 and 2), thereby limiting normal heatpipe operation.

Furthermore, note that isopropanol and water are fully miscible over the whole composition range. In addition, the slightly polar nature of the hydroxyl group in isopropanol forms hydrogen bonds with water. This provides the pair with a decent heat of vaporization.

The relatively wide liquid composition in which to select the binary pair composition for the working fluid may be useful from a manufacturing perspective. For example, this property may allow a larger margin of safety in which the liquid composition can vary. Note that the variation may result from normal manufacturing tolerances, as well as from handling and other operations.

Figure 4:
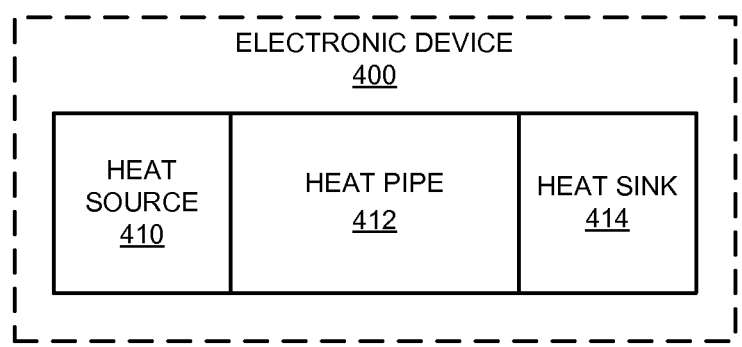
FIG. 4 is a block diagram illustrating an electronic device in accordance with an embodiment of the present disclosure.

The preceding embodiments of the heat pipe may be used in a wide variety of applications. A general application of the heat pipe is shown in FIG. 4, which presents a block diagram illustrating an electronic device 400. This electronic device includes: heat source 410, heat pipe 412 (which may include one or more of the heat pipes in the preceding embodiments) and heat sink 414. During operation, heat source 410 generates heat in electronic device 400, heat sink 414 removes heat from electronic device 400, and heat pipe 412 transports heat from heat source 410 to heat sink 414.

Electronic device 400 may include: VLSI circuits, communication systems (such as in wavelength division multiplexing), storage area networks, data centers, networks (such as local area networks), and/or computer systems (such as multiple processor-core computer systems). For example, an electronic device 400 may be included in a backplane that is coupled to multiple processor blades, or electronic device 400 may couple different types of components (such as processors, memory, I/O devices, and/or peripheral devices). In some embodiments, electronic device 400 performs the functions of: a switch, a hub, a bridge, and/or a router.

Note that electronic device 400 may include, but is not limited to: a server, a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, and/or another electronic computing device. Moreover, note that a given computer or computer system may be at one location or may be distributed over multiple, geographically dispersed locations.

The embodiments of the heat pipe and/or the electronic device may include fewer components or additional components. Furthermore, although the heat pipe and the electronic device in the preceding discussion are illustrated as having a number of discrete items, these embodiments are intended to be functional descriptions of the various features that may be present rather than structural schematics. Consequently, in these embodiments two or more components may be combined into a single component, and/or a position of one or more components may be changed.

Figure 5:
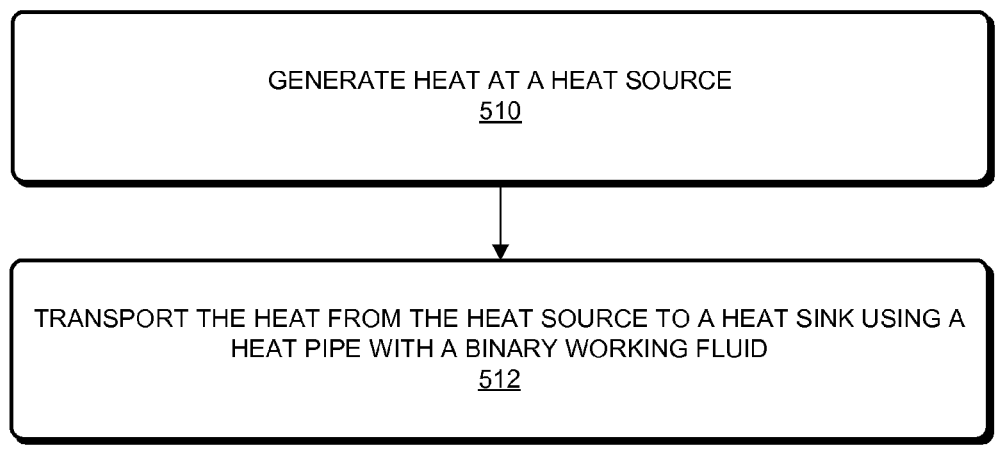
FIG. 5 is a flow diagram illustrating a method for fabricating a bump in accordance with an embodiment of the present disclosure.

We now describe embodiments of the method. FIG. 5 presents a flow diagram 500 illustrating a method for removing heat from a heat source. During this method, the heat source generates heat (operation 510) during operation. Then, the heat pipe with a binary working fluid transports the heat from the heat source to a heat sink (operation 512). The heat pipe includes a housing with an outer surface and an inner surface that defines a cavity. Moreover, the heat pipe includes the binary working fluid in the cavity having a composition proximate to and less than or equal to the azeotropic point in a thermodynamic phase diagram as a function of temperature and the composition of the binary working fluid. Furthermore, in a liquid phase of the binary working fluid, a boiling point of the binary working fluid as a function of the composition in the thermodynamic phase diagram is approximately constant.

In some embodiments, method 500 includes additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A heat pipe, comprising:
    a housing including a first end to couple to a heat source and a second end to couple to a heat sink, wherein the housing has an outer surface and an inner surface that defines a cavity in the heat pipe;
    a wick structure coupled to the inner surface, wherein the wick structure at least partially fills the cavity; and
    a binary working fluid in the cavity including a composition proximate to and less than an azeotropic point in a thermodynamic phase diagram as a function of a temperature and the composition of the binary working fluid, wherein the binary working fluid includes isopropanol and water, and wherein the composition is between 66 and 88% of the isopropanol by weight, and
    wherein, in a liquid phase of the binary working fluid, a boiling point of the binary working fluid as a function of the composition in the thermodynamic phase diagram is approximately constant.

2. The heat pipe of claim 1, wherein the composition is between 80 and 85% of the isopropanol by weight.

3. The heat pipe of claim 1, wherein components in the binary working fluid are fully miscible as a function of the temperature and the composition in the thermodynamic phase diagram.

4. The heat pipe of claim 1, wherein the water in the binary working fluid has a non-zero dipole moment.

5. The heat pipe of claim 1, wherein the isopropanol in the binary working fluid forms a hydrogen bond with the water.

6. The heat pipe of claim 1, wherein, at the azeotropic point, a composition of a gas phase of the binary working fluid equals a composition of a liquid phase of the binary working fluid.

7. The heat pipe of claim 1, wherein the boiling point varies by less than a degree Celsius as a function of the composition in the thermodynamic phase diagram for the composition proximate to and less than the azeotropic point.

8. An electronic device, comprising:
    a heat source that, during operation, generates heat in the electronic device;
    a heat sink that, during operation, removes the heat from the electronic device; and
    a heat pipe that, during operation, transports the heat from the heat source to the heat sink, wherein the heat pipe comprises:
        a housing including a first end thermally coupled to the heat source and a second end thermally coupled to the heat sink, wherein the housing has an outer surface and an inner surface that defines a cavity in the heat pipe;
        a wick structure coupled to the inner surface, wherein the wick structure at least partially fills the cavity; and
        a binary working fluid in the cavity including a composition proximate to and less than an azeotropic point in a thermodynamic phase diagram as a function of a temperature and the composition of the binary working fluid, wherein the binary working fluid includes isopropanol and water, wherein the composition is between 66 and 88% of the isopropanol by weight, and
        wherein, in a liquid phase of the binary working fluid, a boiling point of the binary working fluid as a function of the composition in the thermodynamic phase diagram is approximately constant.

9. The electronic device of claim 8, wherein components in the binary working fluid are fully miscible as a function of the temperature and the composition in the thermodynamic phase diagram.

10. The electronic device of claim 8, wherein the water in the binary working fluid has a non-zero dipole moment.

11. The electronic device of claim 8, wherein the isopropanol in the binary working fluid forms a hydrogen bond with the water.

12. The electronic device of claim 8, wherein, at the azeotropic point, a composition of a gas phase of the binary working fluid equals a composition of a liquid phase of the binary working fluid.

13. The electronic device of claim 8, wherein the boiling point varies by less than a degree Celsius as a function of the composition in the thermodynamic phase diagram for the composition proximate to and less than the azeotropic point.

14. A method for removing heat from a heat source, the method comprising:
    generating the heat by operating the heat source; and
    transporting the heat from the heat source to a heat sink using a heat pipe,
    wherein the heat pipe includes a housing with an outer surface and an inner surface that defines a cavity;
    wherein the heat pipe includes a binary working fluid in the cavity including a composition proximate to and less than an azeotropic point in a thermodynamic phase diagram as a function of a temperature and the composition of the binary working fluid, wherein the binary working fluid includes isopropanol and water, wherein the composition is between 66 and 88% of the isopropanol by weight; and
    wherein, in a liquid phase of the binary working fluid, a boiling point of the binary working fluid as a function of the composition in the thermodynamic phase diagram is approximately constant.

* * * * *